US005617046A

United States Patent [19]
Palara et al.

[11] Patent Number: 5,617,046

[45] Date of Patent: Apr. 1, 1997

[54] GENERATION OF A DIAGNOSTIC SIGNAL WHEN THE CURRENT THROUGH A POWER TRANSISTOR REACHES A LEVEL CLOSE TO A LIMIT CURRENT

[75] Inventors: Sergio Palara, Acitrezza; Stefano Sueri, Catania, both of Italy

[73] Assignees: SGS-Thomson Microelectronics, S.r.l., Agrate Brianza; Consorzio per la Ricerca sulla Microelettronica nel Mezzogiorno, both of Italy

[21] Appl. No.: 272,786

[22] Filed: Jul. 8, 1994

[30] Foreign Application Priority Data

Nov. 29, 1993 [EP] European Pat. Off. .............. 93830473

[51] Int. Cl.[6] .............................................. H03K 19/082

[52] U.S. Cl. ......................... 327/110; 327/312; 327/327; 327/513

[58] Field of Search .................................... 327/110, 312, 327/322, 513

[56] References Cited

U.S. PATENT DOCUMENTS

| | | | |
|---|---|---|---|
| T957,008 | 4/1977 | Sheng | 307/252 N |
| 4,914,317 | 4/1990 | Agiman | 327/322 |
| 4,914,357 | 4/1990 | Valley | 327/513 |
| 5,168,209 | 12/1992 | Thiel | 327/513 |
| 5,424,665 | 6/1995 | Sueri et al. | 327/110 |
| 5,459,425 | 10/1995 | Yasuda | 327/110 |

FOREIGN PATENT DOCUMENTS

| | | | |
|---|---|---|---|
| 0031471 | 7/1981 | European Pat. Off. | G01R 19/165 |
| 0281528 | 9/1988 | European Pat. Off. | F02P 3/05 |
| 3533523 | 4/1986 | Germany | G01R 31/02 |

*Primary Examiner*—Margaret Rose Wambach
*Attorney, Agent, or Firm*—Felsman, Bradley, Gunter & Dillon, LLP

[57] ABSTRACT

A diagnostic signal, indicative of the reaching of a predefined level, lower than a fixed maximum limit value, by the current flowing through a power transistor, is generated while employing a single comparator of a reference voltage with the voltage present across a sensing resistance, thus preventing problems arising from different offset characteristics of distinct comparators. By the use of current mirrors, the generation of a diagnostic signal when the current reaches a level that can be fixed very close to the maximum limit value, may be reliably triggered, irrespectively of the offset characteristic of the single comparator employed.

22 Claims, 3 Drawing Sheets

GENERATION OF A DIAGNOSTIC SIGNAL WHEN THE CURRENT THROUGH A POWER TRANSISTOR REACHES A LEVEL CLOSE TO A LIMIT CURRENT

BACKGROUND OF THE INVENTION

For controlling the energy stored in an inductive load, it is important to make available a diagnostic signal when the current in the inductor reaches a preset level.

A driving system for an inductor is depicted in FIG. 1. The inductor L is connected between a supply node Vs and a power transistor $T_1$ that acts as a switch, driven by a driver circuit (DRIVER) to an input of which a signal $V_{IN}$ is applied.

As shown in FIG. 2, when $V_{IN}$ goes high, $T_1$ turns-on and a current $I_c$ starts to flow through the inductor, increasing with a linear law in function of time. For any value I reached by the current $I_c$, the corresponding energy that is stored in the inductance is given by:

$$E=\frac{1}{2}LI^2$$

The power stage normally comprises a circuit for limiting the maximum current in order to avoid destruction of the transistor. Therefore in the diagram of FIG. 2, the current is limited to a maximum value $I_{max}$.

Moreover, if the transistor $T_1$ must be turned-off always at the same level of energy stored in the inductor, it is necessary to produce a signal when the current I reaches a preset level $I_D$. That level is chosen in order to optimize the energy stored in the inductor at the end of each charging phase, that is when $T_1$ turns off. This is often required, for example, in electronic spark-plug driving systems.

In the latter systems it is also necessary that the level $I_D$ at which the turning off of the transisotor $T_1$ occurs be very close to the maximum current $I_{max}$.

In conventional systems, these requirements are achieved in the manner depicted in FIG. 3. A maximum current limiting circuit $A_1$ (LIMITER) acts on the driver circuit (DRIVER) when the voltage drop across the sensing resistance $R_s$, due to the current $I_c$, equals the reference voltage $E_1$, that is when $R_s*I_{max}=E_1$. Similarly, a diagnostic signal, shown as $V_D$ in FIG. 2, is produced when $R_s*I_D=E_2$. It is worth to be considered that, for the above reported reasons, $I_D$ may have a value very close to $I_{max}$. For this purpose, as shown in FIG. 3, a second diagnostic comparator (DIAGNOSTIC) $A_2$ is employed.

Since $I_D$ must be lower than $I_{max}$, though close thereto, $E_1$ must also be greater than $E_2$ but must have a value very close thereto. The absolute values of $E_1$ and $E_2$ should on the other hand be as low as possible, because they correspond to a voltage drop on $R_s$ due to the current $I_c$. Such a voltage drop is in series with the saturation voltage of the transistor $T_1$ and causes power dissipation. For this reason the voltage on $R_s$, and therefore also $E_1$ and $E_2$, should not be greater than few tens of mV. This means that if a diagnostic signal, for example greater than 90% of the limit current $I_{max}$, is required, the relation $E_2>0.9*E_1$ must be verified. As a numeric example, by assuming $I_{max}=5$ A and $R_s=10$ mΩ, it will be $E_1=50$ mV and therefore $E_2>0.9*50$ mV=45 mV. This means that $E_1-E_2<5$ mV. Occasionally, $E_2>0.95*E_1$ may be required and the difference between $E_1$ and $E_2$ must be even smaller than few mV.

The known arrangement of FIG. 3 is critical, because the voltage drop on $R_s$ at which the operational amplifiers $A_1$ and $A_2$ must react is very small (in the order of millivolts) and is comparable, in terms of order of magnitude, with the voltage offset of the comparators that are employed. This may determine a non-negligeable imprecision in signalling the reaching by the current $I_c$ of the diagnostic level $I_D$. Eventually, if the offset of the differential amplifier $A_2$ become greater in absolute value than the voltage difference $E_1-E_2$, the system will not produce the required diagnostic signal, with serious consequence on the functioning of the system.

In other words, in all the applications where, for obvious reasons of optimization, the current level $I_D$ must be fixed very close to the limit level $I_{max}$, the known circuits may be operating in extremely critical conditions. They may therefore lose in reliability and precision in ensuring a correct ratio between $I_D$ and $I_{max}$.

OBJECTIVE AND SUMMARY OF THE INVENTION

An objective of the present invention is to provide a system for generating a diagnostic signal, indicative of the reaching, by the current flowing through a power transistor, of a preset level, the precision of which is substantially insensitive to the input offset of the respective detecting circuits.

A further aim of the invention is to simplify the known circuits by employing a single monitoring comparator, in order to eliminate the imprecision deriving from different characteristics of equivalent input offset of distinct monitoring comparators.

The circuit of the invention employs a single detecting differential amplifier. It is capable of producing a signal, the level of which is a function of the difference between a reference voltage and the voltage across a resistance sensing the current flowing through the power transistor. The signal produced by the differential amplifier (comparator) is conventionally employed for driving a transistor that is functionally connected so as to subtract part of a driving current delivered toward the power transistor by a conventional driver circuit. In this way, a negative reaction is implemented, determining a maximum limit value $I_{max}$ of the current flowing through the power transistor. According to a preferred embodiment of the invention, the same signal produced by the comparator is used for driving a second transistor through which a current, essentially lower than said current subtracted by the first transistor, is forced. The signal present across said second transistor is employed for producing the desired diagnostic signal by employing a threshold circuit. Specifically, the second transistor, driven in a current mirror relationship with the first current limiting transistor, reaches a state of saturation before the first transistor and then determines the triggering of a threshold circuit that generates the diagnostic signal upon the reaching of a current level $I_D$, positively lower by a pre-established quantity than the maximum limit current value $I_{max}$. The current forced through the second transistor is a mirrored current that may have a given ratio with a driving current that is delivered toward the power transistor.

BRIEF DESCRIPTION OF THE DRAWINGS

The different features and advantages of the invention will become even clearer through the following description of an important embodiment and by referring to the attached drawings, wherein.

GENERAL DESCRIPTION OF THE INVENTION

Figure 1:
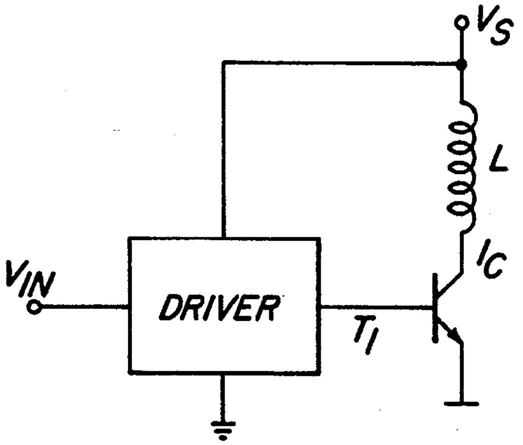
FIG. 1 is a functional block diagram of an output stage for driving a load L.
Figure 2:
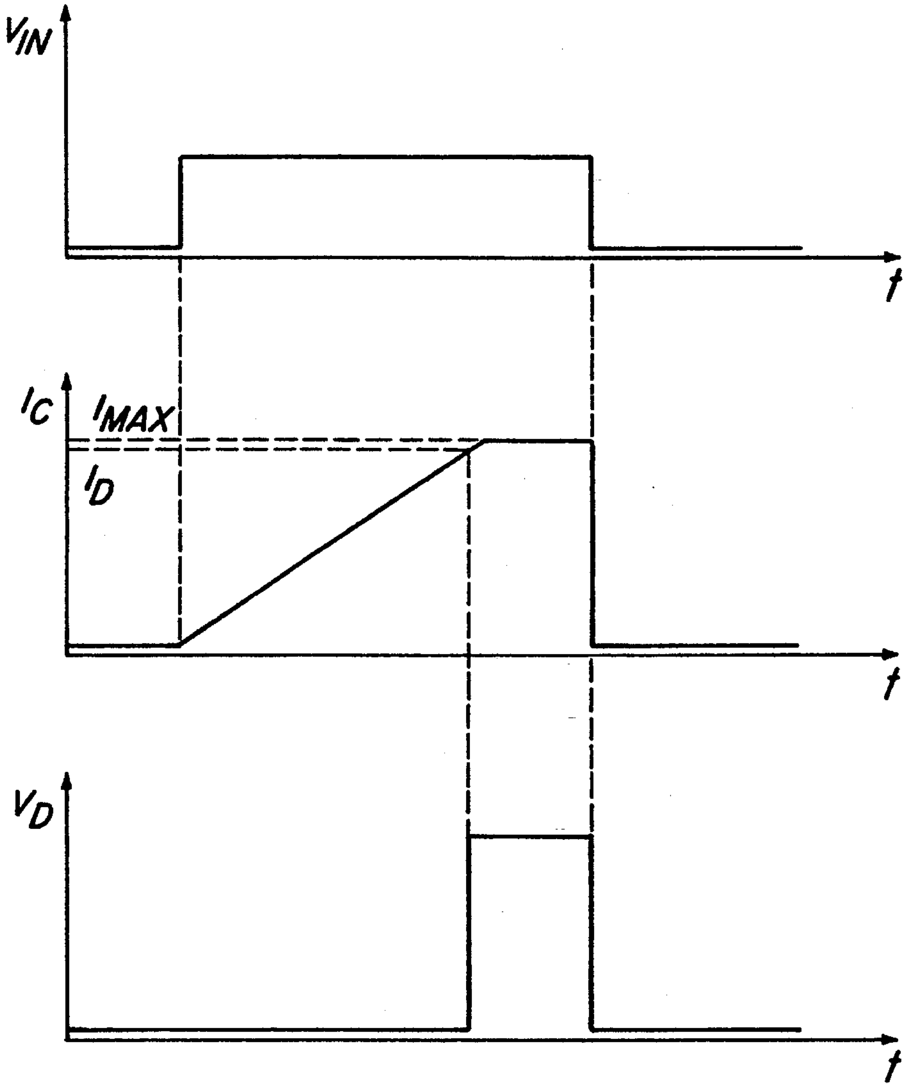
FIG. 2 shows a series of diagrams of operation of a power stage, according to certain recurrent requisites for this type of circuit, as described above.
Figure 3:
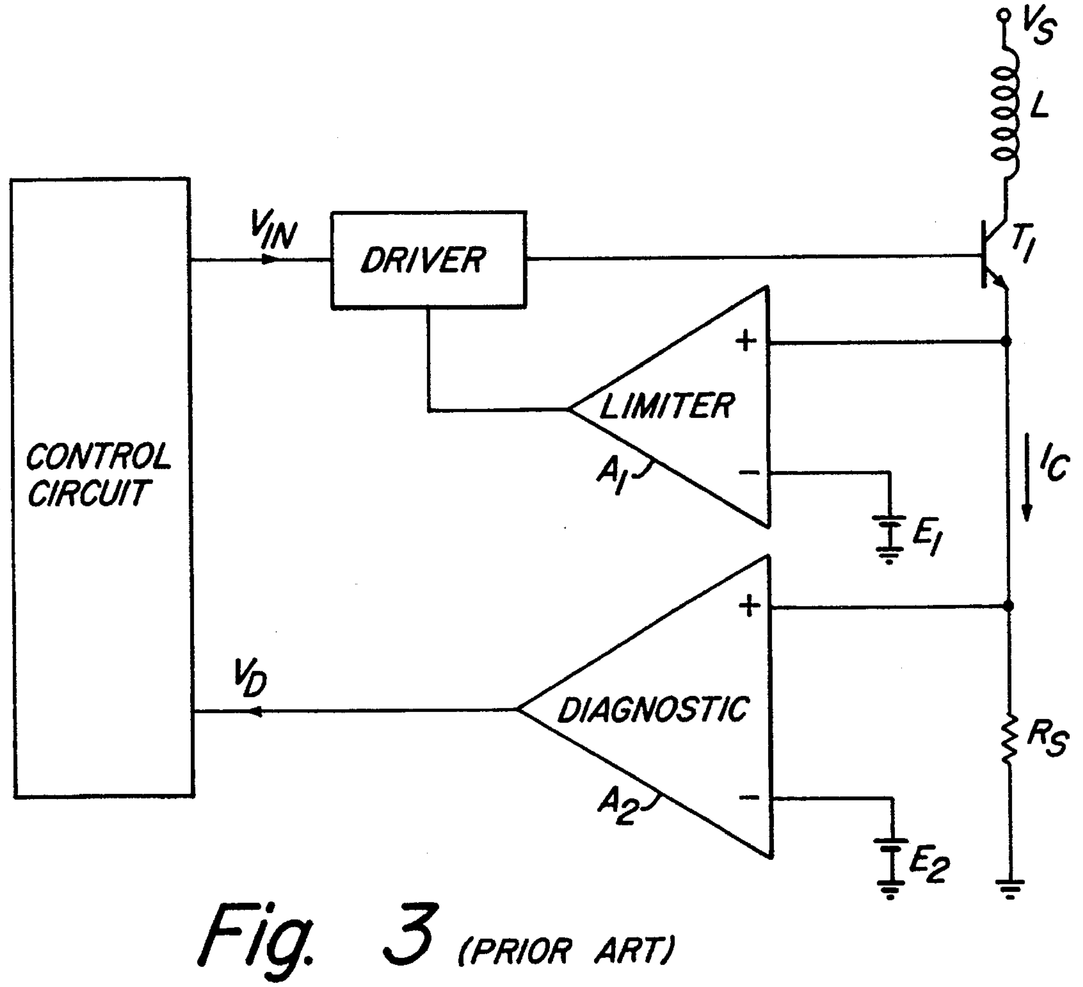
Fig. 3 (PRIOR ART)
FIG. 3 is a functional block diagram of a control system for a power stage according to the requisites set forth in the diagrams of FIG. 2, as described above.
Figure 4:
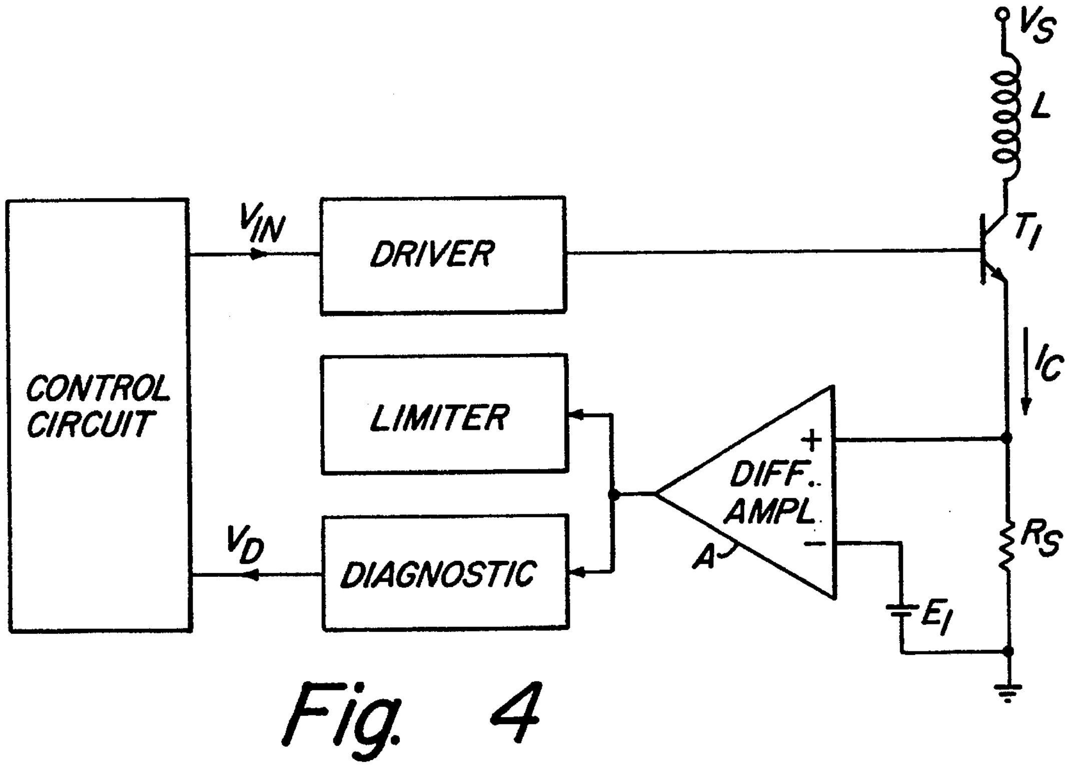
FIG. 4 is a functional block diagram of a control circuit for a power stage according to the present invention.

The functional block diagrams of FIGS. 3 and 4 point out the distinction between the known method for generating a diagnostic signal $V_D$, depicted in FIG. 3, and the method of the invention depicted in FIG. 4.

As may be observed, the invention uses a single comparator, which may be constituted by a differential amplifier A (comparator). Said differential amplifier A is capable of generating a signal in function of the difference between a reference voltage $E_1$ and the voltage present across a sensing resistance $R_s$, through which the current $I_c$ flowing in the power transistor $T_1$ (and in the load L) flows.

The signal produced by the comparator A drives two circuits. The first circuit (shown as LIMITER in FIG. 4) produces a signal limiting the maximum current that may flow through the power transistor $T_1$. Said limiting signal acts on the driver circuit (DRIVER) that delivers a driving current to the power transistor $T_1$. The second circuit (shown as DIAGNOSTIC) is a circuit capable of producing a diagnostic signal $V_D$ upon the reaching, by the current $I_c$, of a value $I_D$. Said value $I_D$ is lower by a re-established amount than the maximum limit value $I_{max}$, as established by the LIMITER circuit, of the current $I_c$.

PREFERRED EMBODIMENT OF THE INVENTION

Figure 5:
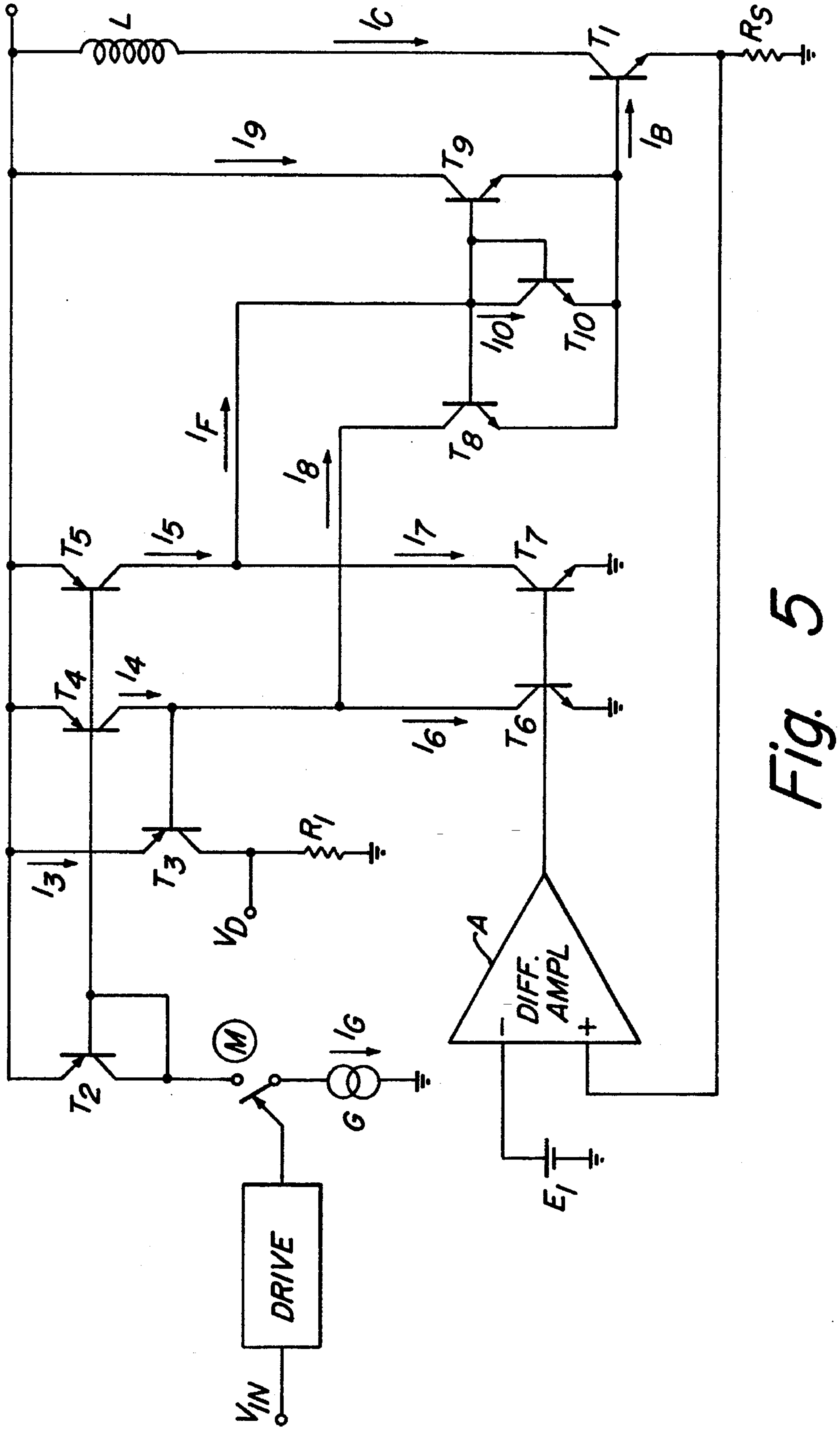
FIG. 5 is a circuit diagram of an embodiment of the circuit of the invention.

A preferred embodiment of the circuit of the invention is shown in FIG. 5.

The circuit operates in the following manner.

When $V_{IN}$ is commanded high, the control circuit CONTROL (not shown in FIG. 5), through the driver circuit DRIVE, closes the switch M and a current $I_G$ flows in a transistor $T_2$. Also transistors $T_4$ and $T_5$, both connected in a current mirror configuration with the transistor $T_2$, are turned-on and generate currents, the value of which will depend on the respective ratio of emitter area with $T_2$. $T_5$ provides a driving current $I_5=I_F$, to the base of a transistor $T_9$, which activates the power transistor $T_1$ with a base current $I_9=I_B$. Of course, the equalities: $I_B=I_9=I_F*h_{FE}(T_9)$ (where $h_{FE}(T_9)$ indicates the current gain of the transistor $T_9$) will be verified, and the current $I_c$ will start to flow in the inductor L through the power transistor $T_1$.

When $I_c$ reaches the value $I_{max}=E_1/R_S$, the differential amplifier A is activated and through its output starts to deliver current to the bases of transistors $T_6$ and $T_7$.

$T_7$ starts to absorb a current $I_7$, by subtracting it from the driving current $I_5$, so that, being $I_F=I_5-I_7$ and $I_5$ being constant, upon an increase of $I_7$, $I_F$ will decrease, and therefore $I_9=I_B$ will also decrease. Finally, when $I_B$ has dropped down to the value given by: $I_B=I_c/h_{FE}(T_1)$, the current through the load L would stabilize at a maximum level $I_{max}$. It cannot be overcome in view of the fact that the feedback loop of the amplifier A tends to maintain the condition $E_1=I_{max}*R_S$.

According to the invention, to obtain a diagnostic signal $V_D$, the transistor $T_6$ is employed. $T_6$ is functionally connected in a current mirror configuration with the transistor $T_7$. Therefore, the two transistors $T_6$ and $T_7$ will reach a state of conduction simultaneously and with a current ratio that directly depends on the ratio between their emitter areas. As an example, it may be assumed that $I_6=I_7$. A diagnostic signal: $V_D=R_1*I_3$ is generated by a threshold circuit formed by the stage comprising a transistor $T_3$ and a resistor $R_1$. The diagnostic signal $V_D$ is generated upon the turning-on of $T_3$, which is determined by the signal present substantially across the transistor $T_6$. The turning-on of $T_3$ will occur only if: $I_6>I_4$. Since $I_6=I_7=I_5-I_F$ ($I_F$ being equal to $I_{max}/[h_{FE}(T_1)*h_{FE}(T_9)]$), the condition: $I_4<I_5-I_F$ has to be imposed. Therefore, the transistor $T_6$, once it has absorbed all the current $I_4$, saturates, and activates $T_3$, thus determining the generation of the diagnostic signal $V_D$.

The diagnostic signal $V_D$ is always produced before the reaching of the maximum limit current. In fact, as already mentioned, $I_4<I_5-I_F$, and being $I_6=I_7$, the collector voltage of the transistor $T_6$ tends to fall before the collector voltage of $T_7$. By suitably adjusting the emitter area ratio between $T_6$ and $T_7$ and between $T_4$ and $T_5$, it is possible to precisely determine a certain ratio $I_D/I_{max}$, which may also be very close to unity.

The only parameter of the circuit described above, which may still determine an imprecision in the definition of the level of current $I_D$ in the inductor L at which the diagnostic signal $V_D$ is generated, may be desumed from the expression already reported above: $I_F=I_{max}/[h_{FE}(T_1)*h_{FE}(T_9)]$. In fact, $I_F$ depends on the current gains of $T_1$ and $T_9$, which may vary with the temperature and/or be subject to a process "spread". This cause of possible imprecision may be better understood by considering the expressions: $I_7=I_5-I_F$, $I_6>I_4$ and $I_6=I_7$. The first equality exhibits a strong dependence on temperature due to the term $I_F$, while the second inequality is independent of temperature. As a consequence, the third equality above could be incoherent with the first two relationships.

In order to prevent the effects of this possible problem, an additional circuit, formed by the transistors $T_8$ and $T_{10}$, may be introduced, as shown in the embodiment of FIG. 5.

The function of the additional circuit is the following. $T_8$ and $T_{10}$ are connected in current mirror configuration with the transistor $T_9$. Therefore the following conditions hold: $I_F=I_{10}$; $I_9=A_9/A_{10}*I_{10}$; $I_8=A_8/A_{10}*I_{10}$ where $A_8$, $A_9$ and $A_{10}$ are the respective emitter areas of the transistors. Moreover, with the addition of the circuit composed formed by $T_8$ and $T_{10}$, it may be shown that, in order for a diagnostic signal $V_D$ to be generated, the following conditions must hold: $I_6>I_4-I_8$; while $I_7=I_5-I_F$; but $I_F=I_{10}$ and $I_8=A_8/A_{10}*I_{10}$. From where, by assuming for example $A_8=A_{10}$, the following relationships are derived:

$$I_6>I_4-I_8 \qquad (1)$$

$$I_7=I_5-I_8 \qquad (2)$$

by having set:

$$I_6=I_7 \qquad (3).$$

Dependence on the current gain of transistors is exibited only by the current $I_8$, which (from FIG. 5) is given by:

$$I_8 = \frac{I_c}{h_{FE}(T_1) * \left(1 + \frac{A_{10}}{A_8} + \frac{A_9}{A_8}\right)}$$

However, the term $I_8$ is present both in the expression (1) and in the expression (2) which, if combined with the equation (3), show that the condition of generation of a diagnostic signal $V_D$ is practically independent of the current gain of the power transistor $T_1$.

Therefore, the present invention advantageously provides a circuit generating a diagnostic signal wherein the ratio between $I_D$ and $I_{max}$ no longer depends on the input equivalent offset of the comparator, as in the circuits of the prior art. In fact, the respective circuits that determine, one, the maximum limit value $I_{max}$ of the current through the output power transistor, and the other, the generation of a diagnostic signal upon the reaching of a certain level $I_D$ by said current through the power transistor, are both driven by the same signal produced by the comparator. The circuit permits to fix said ratio even very close to unity, though ensuring a correct operation of the circuit also in presence of disturbances. In practice, the invention allows to optimize the energy handled by the power transistor, while retaining a high degree of safety and realiability.

What is claimed is:

1. A method for generating a diagnostic signal, indicative of the reaching of a predefined value, lower than a maximum limit value, by the current flowing through a power transistor, comprising the steps of:

generating a signal, which is function of the difference between a reference voltage and a voltage produced on a sensing resistance through which said current flows;

driving with said signal a first transistor, functionally connected to subtract part of a driving current delivered to said power transistor; and driving with said signal a second transistor;

forcing through said second transistor a current lower than said subtracted current, for saturating the second transistor; and using a signal present across said saturated second transistor for triggering the generation of said diagnostic signal so as to signal the reaching of said predefined value.

2. A circuit for limiting the current of a power transistor and for generating a diagnostic signal, indicative of the reaching, by a current flowing through the power transistor, of a preset level, lower than a maximum current level, comprising:

a differential amplifier configured to generate a signal, the level of which is a function of the difference between a reference voltage and a voltage present across a resistance sensing said current flowing through the power transistor;

at least a first transistor driven by said signal, functionally connected to subtract part of a driving current delivered to said power transistor by a control circuit, and accordingly determine a maximum limit value of said current flowing through the power transistor;

at least a second transistor driven by said signal;

circuitry for forcing through said second transistor a current lower than said current subtracted by said first transistor; and a threshold circuit, driven by a signal present across said second transistor, and connected to produce said diagnostic signal.

3. A circuit according to claim 2, further comprising a current mirror circuit, including an input transistor and third and fourth transistors, and connected and configured to mirror a control current through said third transistor constituting said circuitry for forcing said current through said second transistor, and through said fourth transistor connected to deliver said driving current to said power transistor.

4. A circuit according to claim 3, wherein said third transistor has a smaller size than said fourth transistor.

5. A circuit according to claim 3, wherein said power transistor is driven through a fifth transistor, driven by a current proportional to the difference between the current driven by said fourth transistor and said current subtracted by said first transistor.

6. A circuit according to claim 5, further comprising a sixth transistor, connected to said fifth transistor to form a current mirror with a seventh diode-configured transistor, said sixth transistor absorbing current from the driving node of said threshold circuit; the ratio among the respective emitter areas of said fifth, sixth and seventh transistors being such as to render the triggering condition of said threshold circuit independent of variations of the current gain of said power transistor.

7. A circuit for limiting the current through a power transistor and for generating a diagnostic signal, comprising:

a comparator, connected to detect the voltage across a first resistor through which the same current flowing through the power transistor flows, to compare said voltage with a reference maximum voltage, and to produce a signal according to the difference therebetween;

a limiter circuit, connected to said comparator to receive said signal and to control the maximum value of a current driving the power transistor and provided by a driver circuit, wherein said limiter circuit includes a first transistor, connected to be driven by said signal and to subtract part of said current driving the power transistor, so as to limit the maximum value thereof;

a diagnostic circuit, connected to said comparator to receive said signal and to produce a diagnostic signal when the current flowing through said power transistor reach a fixed value lower than a maximum value established by said limiter circuit, the ratio between said fixed value and said maximum value being preset, said diagnostic signal being input to a control circuit controlling said driver circuit, wherein said diagnostic circuit includes:

a second transistor, connected to be driven by said signal;

circuitry connected to force a current through said second transistor, the value of said current being lower than the value of a total current flowing through said second transistor as determined by said signal; and a threshold circuit, connected to be driven by that part of said total current flowing through said second transistor not forced by said circuitry, to turn on and accordingly provide said diagnostic signal when said second transistor has absorbed all said current forced by said circuitry, and said first transistor has not absorbed all said subtracted current.

8. A circuit according to claim 7, wherein said current forced by said circuitry is lower than said current subtracted by said first transistor, and said first and second transistors carry the same value of current.

9. A circuit according to claim 7, wherein said circuitry includes a third transistor connected to be driven by a current proportional to said current driving the power transistor, and providing said current forced through said second transistor.

10. A circuit according to claim 9, further comprising an input diode-configured transistor through which a constant current is forced, according to a control signal provided by said control circuit, said input transistor being connected in a current mirror configuration with said third transistor and with a fourth transistor coupled to said power transistor to provide said driving current thereof.

11. A circuit according to claim 10, wherein the emitter area of said first and second transistors are equal and the emitter area of said third transistor is lower than the emitter area of said fourth transistor.

12. A circuit according to claim 10, wherein an additional circuit provides a coupling between said driving current provided by said fourth transistor and said current flowing through said second transistor, whereby said current driving said threshold circuit is generated independently of the current gain of the power transistor.

13. A circuit according to claim 7, wherein said threshold circuit includes a fifth transistor and a second resistor connected in series, said fifth transistor being driven by said part of said current flowing through said second transistor not forced by said circuitry, the voltage across said second resistor providing said diagnostic signal.

14. A circuit according to claim 7, wherein said comparator is provided by a differential amplifier.

15. A circuit for an inductive load to be driven, comprising:

a power transistor connected in series with the load to provide a current thereto;

a current mirror circuit controlled by a control circuit to output a driving current to said power transistor;

a comparator connected to detect, through a sensing resistor, said current provided to the load and flowing through said power transistor, and to provide a signal according to the difference between said current and a fixed maximum current;

a first transistor connected to be driven by said signal and to subtract part of said driving current output from said current mirror circuit so as to limit said current flowing through said power transistor to said fixed maximum current;

a second transistor connected to be driven by said signal;

circuitry connected to force through said second transistor a first current; and a threshold circuit driven by a second current flowing through said second transistor and providing a diagnostic signal;

wherein the ratios between said first current and said part of said driving current subtracted from said first transistor, and between a total current flowing through said second transistor and said part of said driving current subtracted from said first transistor are chosen, so as to allow the flowing of said second current when said comparator provides a signal corresponding to a fixed current flowing through said power transistor, lower than said fixed maximum current.

16. A circuit according to claim 15, wherein said first and second transistors are connected therebetween and to receive said signal from said comparator in a current mirror configuration.

17. A circuit according to claim 16, wherein said circuitry is provided by a third transistor, connected in a current mirror configuration with said current mirror, to provide said first current.

18. A circuit according to claim 17, wherein the ratios between the emitter areas of said first and second transistors and between the emitter areas of said third transistor and of an output transistor of said current mirror are chosen so as to determine a preset ratio between said fixed current flowing through said power transistor and said fixed maximum current.

19. A circuit according to claim 15, wherein said threshold circuit includes a fourth transistor and a resistor connected in series, said fourth transistor being driven by said second current, the voltage across said resistor providing said diagnostic signal.

20. A circuit according to claim 15, wherein said comparator is provided by a differential amplifier.

21. A circuit according to claim 15, further comprising a fifth transistor, connected to be driven by said current mirror circuit and to drive said power transistor.

22. A circuit according to claim 21, further comprising:

an additional circuit including a sixth transistor and a seventh diode-configured transistor, both in a current mirror configuration with said fifth transistor, said sixth transistor being connected to receive an input current from a driving node of said threshold circuit;

whereby the turning on of said threshold circuit is independent on the current gain of said power transistor.

* * * * *